(12) United States Patent
Bullington et al.

(10) Patent No.: US 11,101,532 B2
(45) Date of Patent: Aug. 24, 2021

(54) RF CIRCULATOR

(71) Applicant: 3D GLASS SOLUTIONS, INC., Albuquerque, NM (US)

(72) Inventors: Jeff A. Bullington, Albuquerque, NM (US); Jeb H. Flemming, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 51 days.

(21) Appl. No.: 16/497,931

(22) PCT Filed: Apr. 26, 2018

(86) PCT No.: PCT/US2018/029559
§ 371 (c)(1),
(2) Date: Sep. 26, 2019

(87) PCT Pub. No.: WO2018/200804
PCT Pub. Date: Nov. 1, 2018

(65) Prior Publication Data
US 2020/0176845 A1 Jun. 4, 2020

Related U.S. Application Data

(60) Provisional application No. 62/491,918, filed on Apr. 28, 2017.

(51) Int. Cl.
*H01P 1/36* (2006.01)
*C03C 3/095* (2006.01)
(Continued)

(52) U.S. Cl.
CPC ............... *H01P 1/36* (2013.01); *C03C 3/095* (2013.01); *C03C 4/04* (2013.01); *C03C 10/0027* (2013.01);
(Continued)

(58) Field of Classification Search
CPC ...... H01P 1/32; H01P 1/36; H01P 1/38; H01P 1/383; H01P 1/387; H01P 1/393;
(Continued)

(56) References Cited

U.S. PATENT DOCUMENTS 2,515,940 A 7/1950 Stookey
2,515,941 A 7/1950 Stookey
(Continued)

FOREIGN PATENT DOCUMENTS

CN 1562831 4/2004
CN 105938928 9/2016
(Continued)

OTHER PUBLICATIONS

International Search Report and Written Opinion for PCT/US2020/28474 dated Jul. 17, 2020 by the USPTO, 7 pp.
(Continued)

*Primary Examiner* — Stephen E. Jones
(74) *Attorney, Agent, or Firm* — Edwin S. Flores; Chalker Flores, LLP

(57) ABSTRACT

The present invention includes a device and method for making an RF circulator/isolator device comprising: a substrate comprising one or more conductive coils, wherein the one or more conductive coils are formed in, on, or about the substrate; an opening in the substrate comprising an iron core, wherein the iron core is formed in the substrate after the formation of the one or more conductive coils, wherein the iron core is positioned and shaped to create a circulator/isolator in the substrate; and one or more connectors, vias, resistors, capacitors, or other integrated circuits of devices connected to the conductive coils of the circulator/isolator.

24 Claims, 1 Drawing Sheet

(51) Int. Cl.
*C03C 4/04* (2006.01)
*C03C 10/00* (2006.01)
*H01P 1/38* (2006.01)
*H01P 11/00* (2006.01)

(52) U.S. Cl.
CPC ............ *C03C 10/0054* (2013.01); *H01P 1/38* (2013.01); *H01P 11/00* (2013.01); *C03C 2204/00* (2013.01)

(58) Field of Classification Search
CPC ...... H01P 11/00; H01P 11/001; H01P 11/002; H01P 11/003; H01P 11/007
USPC .................................................. 333/1.1, 24.2
See application file for complete search history.

(56) References Cited

U.S. PATENT DOCUMENTS

| | | |
|---|---|---|
| 2,628,160 A | 2/1953 | Stookey |
| 2,684,911 A | 7/1954 | Stookey |
| 2,971,853 A | 2/1961 | Stookey |
| 3,904,991 A | 9/1975 | Ishli et al. |
| 3,985,531 A | 10/1976 | Grossman |
| 3,993,401 A | 11/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,444,616 A | 4/1984 | Fujita et al. |
| 4,514,053 A | 4/1985 | Borelli et al. |
| 4,537,612 A | 8/1985 | Borelli et al. |
| 4,647,940 A | 3/1987 | Traut et al. |
| 4,692,015 A | 9/1987 | Loce et al. |
| 4,788,165 A | 11/1988 | Fong et al. |
| 4,942,076 A | 7/1990 | Panicker et al. |
| 5,078,771 A | 1/1992 | Wu |
| 5,147,740 A | 9/1992 | Robinson |
| 5,212,120 A | 5/1993 | Araujo et al. |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A | 5/1999 | Tsukamoto et al. |
| 5,919,607 A | 7/1999 | Lawandy et al. |
| 5,998,224 A | 12/1999 | Rohr et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,383,566 B1 | 5/2002 | Zagdoun |
| 6,485,690 B1 | 11/2002 | Pfost et al. |
| 6,511,793 B1 | 1/2003 | Cho et al. |
| 6,514,375 B2 | 2/2003 | Kijima |
| 6,562,523 B1 | 2/2003 | Wu et al. |
| 6,678,453 B2 | 1/2004 | Bellman et al. |
| 6,686,824 B1 | 2/2004 | Yamamoto et al. |
| 6,783,920 B2 | 8/2004 | Livingston et al. |
| 6,824,974 B2 | 11/2004 | Pisharody et al. |
| 6,843,902 B1 | 1/2005 | Penner et al. |
| 6,875,544 B1 | 4/2005 | Sweatt et al. |
| 6,932,933 B2 | 8/2005 | Halvajian et al. |
| 6,977,722 B2 | 12/2005 | Wohlstadter et al. |
| 7,033,821 B2 | 4/2006 | Kim et al. |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 3/2009 | Okuno |
| 7,603,772 B2 | 10/2009 | Farnsworth et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 | 4/2014 | Flemming et al. |
| 9,385,083 B1 | 7/2016 | Herrault et al. |
| 9,449,753 B2 | 9/2016 | Kim |
| 9,635,757 B1 | 4/2017 | Chen et al. |
| 10,070,533 B2 | 9/2018 | Flemming et al. |
| 10,201,901 B2 | 2/2019 | Flemming et al. |
| 2001/0051584 A1 | 12/2001 | Harada et al. |
| 2002/0015546 A1 | 2/2002 | Bhagavatula |
| 2002/0086246 A1 | 7/2002 | Lee |
| 2002/0100608 A1 | 8/2002 | Fushie et al. |
| 2003/0025227 A1 | 2/2003 | Daniell |
| 2003/0124716 A1 | 7/2003 | Hess et al. |
| 2003/0135201 A1 | 7/2003 | Gonnelli |
| 2003/0156819 A1 | 8/2003 | Pruss et al. |
| 2003/0174944 A1 | 9/2003 | Dannoux |
| 2003/0228682 A1 | 12/2003 | Lakowicz et al. |
| 2003/0231830 A1 | 12/2003 | Hikichi |
| 2004/0008391 A1 | 1/2004 | Bowley et al. |
| 2004/0020690 A1 | 2/2004 | Parker et al. |
| 2004/0155748 A1 | 8/2004 | Steingroever |
| 2004/0171076 A1 | 9/2004 | Dejneka et al. |
| 2004/0184705 A1 | 9/2004 | Shimada et al. |
| 2004/0198582 A1 | 10/2004 | Borelli et al. |
| 2005/0089901 A1 | 4/2005 | Porter et al. |
| 2005/0105860 A1 | 5/2005 | Oono |
| 2005/0150683 A1 | 7/2005 | Farnworth et al. |
| 2005/0170670 A1 | 8/2005 | King et al. |
| 2005/0277550 A1 | 12/2005 | Brown et al. |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Debrow et al. |
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0283948 A1 | 12/2006 | Naito |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0267708 A1 | 11/2007 | Courcimault |
| 2007/0272829 A1 | 11/2007 | Nakagawa et al. |
| 2007/0279837 A1 | 12/2007 | Chow et al. |
| 2007/0296520 A1 | 12/2007 | Hosokawa et al. |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamurar |
| 2008/0245109 A1 | 10/2008 | Flemming et al. |
| 2008/0291442 A1 | 11/2008 | Lawandy |
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0243783 A1 | 10/2009 | Fouquet et al. |
| 2010/0022416 A1 | 1/2010 | Flemminng et al. |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0108525 A1 | 5/2011 | Chien et al. |
| 2011/0170273 A1 | 7/2011 | Helvajian |
| 2011/0195360 A1 | 8/2011 | Flemming et al. |

(56) References Cited

U.S. PATENT DOCUMENTS

| | | |
|---|---|---|
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0119401 A1 | 5/2013 | D'Evelyn et al. |
| 2013/0142998 A1 | 6/2013 | Flemming et al. |
| 2013/0183805 A1 | 7/2013 | Wong et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0145326 A1 | 5/2014 | Lin et al. |
| 2014/0169746 A1 | 6/2014 | Hung et al. |
| 2014/0203891 A1 | 7/2014 | Yazaki |
| 2014/0247269 A1 | 9/2014 | Berdy et al. |
| 2014/0272688 A1 | 9/2014 | Dillion |
| 2014/0367695 A1 | 12/2014 | Barlow |
| 2015/0048901 A1 | 2/2015 | Rogers |
| 2015/0071593 A1 | 3/2015 | Kanke |
| 2015/0210074 A1 | 7/2015 | Chen et al. |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0181211 A1 | 6/2016 | Kamagaing et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk |
| 2018/0323485 A1 | 11/2018 | Gnanou et al. |
| 2020/0275558 A1 | 8/2020 | Fujita |

FOREIGN PATENT DOCUMENTS

| | | |
|---|---|---|
| DE | 102004059252 | 6/2006 |
| EP | 0311274 | 12/1989 |
| EP | 0507719 A1 | 10/1992 |
| EP | 0949648 A1 | 10/1999 |
| EP | 1683571 | 6/2006 |
| JP | 56-155587 | 12/1981 |
| JP | 61149905 | 7/1986 |
| JP | 61231529 A | 10/1986 |
| JP | 62202840 A | 9/1987 |
| JP | 63-128699 A | 6/1988 |
| JP | 08026767 A | 6/1988 |
| JP | H393683 A | 4/1991 |
| JP | 05139787 A | 6/1993 |
| JP | 08179155 A | 12/1994 |
| JP | 10007435 A | 1/1998 |
| JP | 10199728 A | 7/1998 |
| JP | 11344648 A | 12/1999 |
| JP | 2000228615 | 8/2000 |
| JP | 2001033664 A | 2/2001 |
| JP | 2001206735 A | 7/2001 |
| JP | 2005302987 A | 10/2005 |
| JP | 2005215644 A | 11/2005 |
| JP | 2008252797 A | 10/2008 |
| JP | 2012079960 A | 4/2012 |
| JP | 2013062473 A | 4/2013 |
| JP | 2013217989 A | 10/2013 |
| JP | 2014241365 A | 12/2014 |
| JP | 2015028651 | 2/2015 |
| JP | 2015028651 A | 2/2015 |
| JP | H08026767 | 1/2016 |
| JP | 2018200912 A | 12/2018 |
| KR | 100941691 B1 | 2/2010 |
| KR | 101167691 | 7/2012 |
| WO | 2007088058 A2 | 8/2007 |
| WO | 2008119080 | 10/2008 |
| WO | 2008154931 | 12/2008 |
| WO | 2009029733 | 3/2009 |
| WO | 2009062011 | 5/2009 |
| WO | 2009126649 | 10/2009 |
| WO | 2010011939 | 1/2010 |
| WO | 2011100445 | 8/2011 |
| WO | 20111109648 | 9/2011 |
| WO | 2012078213 A1 | 6/2012 |
| WO | 2014062226 | 1/2014 |
| WO | 2014043267 | 3/2014 |
| WO | 2014062311 | 4/2014 |
| WO | 2015108648 A1 | 7/2015 |
| WO | 2015112903 | 7/2015 |
| WO | 2015171597 | 11/2015 |
| WO | 2017132280 | 8/2017 |
| WO | 2017147511 | 8/2017 |
| WO | 2017177171 | 10/2017 |

OTHER PUBLICATIONS

Extended European Search Report 17744848.7 dated Oct. 30, 2019, 9 pp.
Extended European Search Report 17757365.6 dated Oct. 14, 2019, 14 pp.
International Search Report and Written Opinion for PCT/US2019/50644 dated Dec. 4, 2019 by USPTO, 9 pp.
Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Grine, F. et al., "High-Q Substrate Integrated Waveguide Resonator Filter With Dielectric Loading," IEEE Access vol. 5, Jul. 12, 2017, p. 12526-12532.
Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.
International Search Report and Written Opinion for PCT/US2020/026673 dated Jun. 22, 2020, by the USPTO, 13 pp.
Mohamedelhassan, A., "Fabrication of Ridge Waveguides in Lithium Niobate," Independent thesis Advanced level, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.
Aslan, et al., "Metal-Enhanced Fluorescence: an emerging tool in biotechnology" Current opinion in Biotechnology (2005), 16:55-62.
Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.
Beke, S., et al., "Fabrication of Transparent and Conductive Microdevices," Journal of Laser Micro/Nanoengineering (2012), 7(1):28-32.
Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.
Cheng, et al. "Three-dimensional Femtosecond Laser Integration in Glasses" The Review of Laser Engineering, vol. 36, 2008, pp. 1206-1209, Section 2, Subsection 3.1.
Chowdhury, et al, "Metal-Enhanced Chemiluminescence", J Fluorescence (2006), 16:295-299.
Crawford, Gregory P., "Flexible Flat Panel Display Technology," John Wiley and Sons, NY, (2005), 9 pages.
Dang, et al. "Integrated thermal-fluidic I/O interconnects for an on-chip microchannel heat sink," IEEE Electron Device Letters, vol. 27, No. 2, pp. 117-119, 2006.

(56) References Cited

OTHER PUBLICATIONS

Dietrich, T.R., et al., "Fabrication Technologies for Microsystems Utilizing Photoetchable Glass," Microelectronic Engineering 30, (1996), pp. 407-504.
Extended European Search Report 15741032.5 dated Aug. 4, 2017, 11 pp.
Extended European Search Report 15789595.4 dated Mar. 31, 2017, 7 pp.
Geddes, et al., "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
International Search Report and Written Opinion for PCT/US2017/026662 dated Jun. 5, 2017, 11 pp.
International Search Report and Written Opinion for PCT/US2018/029559 dated Aug. 3, 2018, 9 pp.
International Technology Roadmap for Semiconductors, 2007 Edition, "Assembly and Packaging,"9 pages.
Lakowicz, et al.; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
TechNote #205, Bangs Laboratories, www.bangslabs.com/technotes/205.pdf, "Covalent Coupling".
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
Azad, I., et al., "Design and Performance Analysis of 2.45 GHz Microwave Bandpass Filter with Reduced Harmonics," International Journal of Engineering Research and Development (2013), 5(11):57-67.
International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.
European Search Report and Supplemental European Search Report for EP 18828907 dated Mar. 25, 2020, 11 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
Topper, et al., "Development of a high density glass interposer based on wafer level packaging technologies," 2014 IEEE 64th Electronic Components and Technology Conference, May 27, 2014, pp. 1498-1503.
European Search Report and Supplemental European Search Report for EP 18889385.3 dated Dec. 2, 2020, 8 pp.
European Search Report and Supplemental European Search Report for EP 18898912.3 dated Feb. 2, 2021, 10 pp.
Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.
International Search Report and Written Opinion for PCT/US2020/54394 dated Jan. 7, 2021 by the USPTO, 15 pp.
International Search Report and Written Opinion for PCT/US2021/21371 dated May 20, 2021 by the USPTO, 10 pp.

RF CIRCULATOR

CROSS-REFERENCE TO RELATED APPLICATIONS

This application is the National Stage of International Application No. PCT/US2018/029559, filed on Apr. 26, 2018 claiming the priority to U.S. Provisional Application No. 62/491,918 filed on Apr. 28, 2017, the contents of each of which are incorporated by reference herein.

STATEMENT OF FEDERALLY FUNDED RESEARCH

None.

TECHNICAL FIELD OF THE INVENTION

The present invention relates in general to the field of RF circulators, and more particularly, to a novel optimized high frequency RF circulator.

BACKGROUND OF THE INVENTION

Without limiting the scope of the invention, its background is described in connection with RF circulators.

U.S. Pat. No. 9,250,452, issued to Yap, et al., entitled "Tunable photonic RF circulator for simultaneous transmit and receive", is said to teach a photonic RF circulator that provides greater than 40 db of isolation between a Received RF signal and a Transmitted RF signal in a simultaneous transmit and receive device. The photonic RF circulator is said to use light modulation in an optical waveguide grating where the Received RF signal co-propagates with the light and the Transmitted RF signal counter-propagates with the light. In addition, it is said to describe variations that provide for broadening the bandwidth of the T/R isolation and rejection of various noise sources.

U.S. Pat. No. 7,362,195, issued to Chui, entitled "Ferro magnetic metal-insulator multilayer radio frequency circulator", is said to teach a directional RF circulator that directs radio frequency signals without an external biasing magnetic field. The directional RF circulator includes layers of ferromagnetic materials and insulating materials that form a laminated nano-structure. The layers of ferromagnetic materials and insulating materials are selected to have a thickness smaller than the wavelength of the radio frequency signals, and smaller than the skin depth of the signals in the material. The ferromagnetic materials and insulators form a resonant cavity having a resonant frequency near the operating frequency for the signal, and a plurality of connectors can be located around the periphery of the laminated ferromagnetic material to provide input and output ports for the device. This RF circulator is also said to be compatible with semiconductor thin-film processing, and may be integrated onto a monolithic integrated circuit. A method of forming a directional RF circulator is also said to be disclosed.

SUMMARY OF THE INVENTION

The circulator/isolator devices of the present invention can be used for devices and arrays in glass ceramic substrates for electronic, microwave and radiofrequency in general. In one embodiment, the present invention includes a circulator/isolator device comprising: a substrate comprising one or more conductive coils, wherein the one or more conductive coils are formed in, on, or about the substrate; an opening in the substrate comprising an iron core, wherein the iron core is formed in the substrate after the formation of the one or more conductive coils, wherein the iron core is positioned and shaped to create a circulator/isolator in the substrate; and one or more connectors, vias, resistors, capacitors, or other integrated circuits of devices connected to the circulator/isolator. In one aspect, the device further comprises a passivation or coating on the device to protect the device from the environment. In another aspect, the iron core is formed in situ after formation of the one or more conductive coils. In another aspect, the conductive coils comprise copper. In another aspect, the circulator/isolator device has a reduced signal loss when compared to existing circulator/isolator devices. In another aspect, the circulator/isolator device has a loss of less than 50, 40, 30, 25, 20, 15, or 10% of the signal input versus a signal output. In another aspect, the iron core comprises melted or sintered iron particles, microparticles, or nanoparticles. In another aspect, geometry of the circulator/isolator device is substantially circular. In another aspect, the substrate is glass. In another aspect, the substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. In another aspect, the substrate is a glass substrate comprising a composition of: 35-76 weight % silica, 3-16 weight % $H_2O$, 0.003-1 weight % $Ag_2O$, 0.75-13 weight % $B_2O_3$, 8-15 weight % $Li_2O$, and 0.001-0.1 weight % $CeO_2$. In another aspect, the substrate is at least one of: a photo-definable glass substrate comprises at least 0.3 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO and BaO; and optionally has an anisotropic-etch ratio of exposed portion to said unexposed portion is at least one of 10-20:1; 21-29:1; 30-45:1; 20-40:1; 41-45:1; and 30-50:1. In another aspect, the substrate is a photosensitive glass ceramic composite substrate comprising at least silica, lithium oxide, aluminum oxide, and cerium oxide.

In another embodiment, the present invention also includes a method for making a circulator/isolator device, the method comprising: forming on a substrate one or more conductive coils, wherein the one or more conductive coils are formed in, on, or about the substrate; etching an opening in the substrate; depositing iron particles in the opening; melting or sintering the iron particles into an iron core, wherein the iron core is formed in the substrate after the formation of the one or more conductive coils, wherein the iron core is positioned and shaped to create a circulator/isolator in the substrate; and connecting the conductive coils of the circulator/isolator to one or more connectors, vias, resistors, capacitors, or other integrated circuits of devices connected to the circulator/isolator device. In one aspect, the method further comprises coating or depositing a passivation or coating on the circulator/isolator device to protect the circulator/isolator device from the environment. In another aspect, the method further comprises forming iron core in situ after the step of forming the one or more conductive coils. In another aspect, the method further comprises forming iron core in situ after the step of forming the one or more conductive coils in the presence of a noble gas. In another aspect, the conductive coils comprise copper. In another aspect, the circulator/isolator device has a reduced signal loss when compared to existing circulator/isolator devices. In another aspect, the circulator/isolator device has a loss of less than 50, 40, 30, 25, 20, 15, or 10% of the signal input versus an signal output. In another aspect, the iron core comprises melted or sintered iron particles, microparticles, or nanoparticles. In another aspect, a geometry of the circulator/isolator device is substantially circular. In another aspect, the substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. In another aspect, the substrate is a glass substrate comprising a composition of: 35-76 weight % silica, 3-16 weight % $H_2O$, 0.003-1 weight % $Ag_2O$, 0.75-13 weight % $B_2O_3$, 8-15 weight % $Li_2O$, and 0.001-0.1 weight % $CeO_2$. In another aspect, the substrate is at least one of: a photo-definable glass substrate comprises at least 0.3 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO and BaO; and optionally has an anisotropic-etch ratio of exposed portion to said unexposed portion is at least one of 10-20:1; 21-29:1; 30-45:1; 20-40:1; 41-45:1; and 30-50:1. In another aspect, the substrate is a photosensitive glass ceramic composite substrate comprising at least silica, lithium oxide, aluminum oxide, and cerium oxide.

In another embodiment, an RF circulator/isolator device is made by a method comprising: forming on a substrate one or more conductive coils, wherein the one or more conductive coils are formed in, on, or about the substrate; etching an opening in the substrate; depositing iron particles in the opening; melting or sintering the iron particles into an iron core, wherein the iron core is formed in the substrate after the formation of the one or more conductive coils, wherein the iron core is positioned and shaped to create a circulator/isolator in the substrate; and connecting the conductive coils of the circulator/isolator to, e.g., an amplifier, an antenna, a resistor, a capacitor, etc.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not limit the invention, except as outlined in the claims.

The circulator/isolator devices of the present invention can be used for devices and arrays in glass ceramic substrates for electronic, microwave and radiofrequency in general. This invention provides creates a cost effective glass ceramic inductive individual or array device. Where glass ceramic substrate has demonstrated capability to form such structures through the processing of both the vertical as well as horizontal planes either separately or at the same time to form circulator/isolator devices that can be used in a wide variety of telecommunications and other platforms. The novel circulator/isolator glass ceramic devices can be made as stand-alone devices to add to other devices, can be built into a substrate directly and then connected to other electronic components using vias, wire or ball bonding, etc.

In one embodiment, the present invention is a RF circulator/isolator built for an integrated passive device (IPD) that has a decreased size versus currently available options. The present invention can be made by optimizating an Iron Core Material in a Test Vehicle. The test vehicle can include, e.g., one or more types of glass made and formulated as described hereinbelow obtained from, e.g., 3DGS, USA, with methods and parts for improved by iron core filling. First, a standard cavity depth will be used to ensure consistent measurement. Next, components that are formed, added or connected to form a circuit are connected to the circulator/isolator and are then evaluated as testing proceeds and specific volumes are necessary for accurate calculations.

Figure 1:
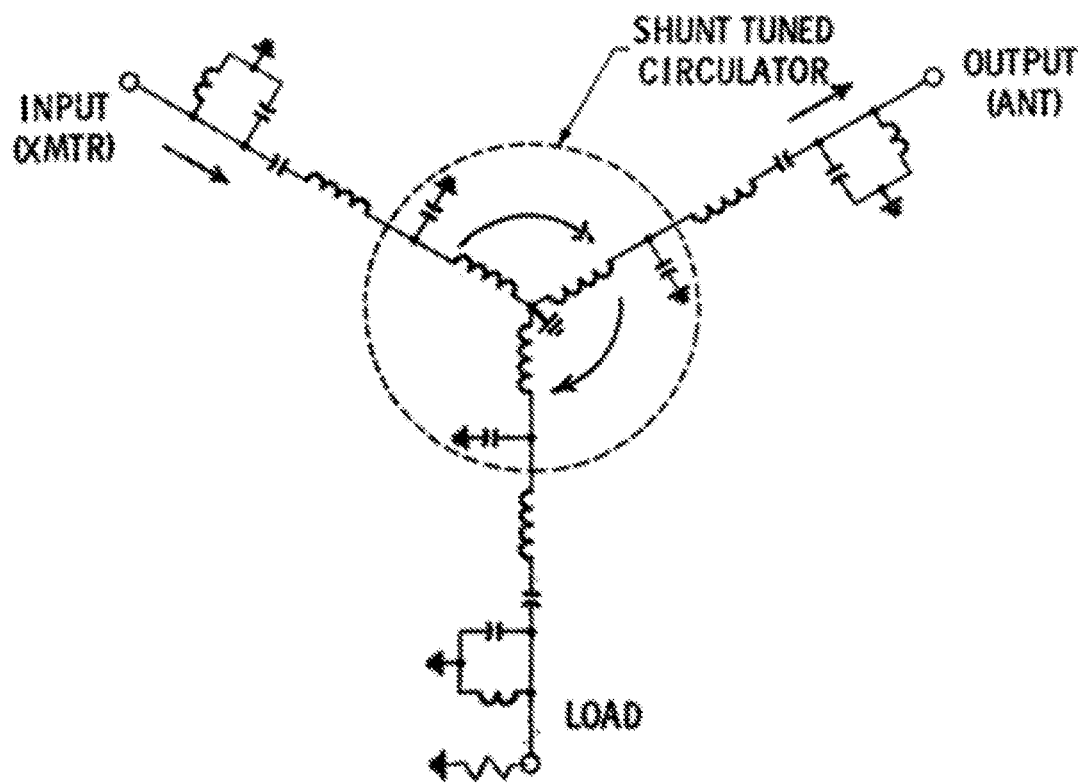
FIG. 1 shows an RF circulator/isolator devices of the present invention.

FIG. 1 shows an RF circulator/isolator devices of the present invention. The present invention includes a method of fabrication a RF circulator/isolator device made by preparing a photosensitive glass ceramic composite substrate comprising at least silica, lithium oxide, aluminum oxide, and cerium oxide, masking a design layout comprising one or more, two or three dimensional inductive device in the photosensitive glass substrate, exposing at least one portion of the photosensitive glass substrate to an activating energy source, exposing the photosensitive glass substrate to a heating phase of at least ten minutes above its glass transition temperature, cooling the photosensitive glass substrate to transform at least part of the exposed glass to a crystalline material to form a glass-crystalline substrate and etching the glass-crystalline substrate with an etchant solution to form one or more angled channels or through holes that are then used in the RF circulator/isolator.

The RF circulator/isolator can be built in, on, our about a glass ceramic (APEX® Glass Ceramic™, 3DGS, USA) as a novel packaging and substrate material for semiconductors, RF electronics, microwave electronics, and optical imaging. APEX® Glass ceramic is processed using first generation semiconductor equipment in a simple three step process and the final material can be fashioned into either glass, ceramic, or contain regions of both glass and ceramic. The APEX® Glass ceramic possesses several benefits over current materials, including: easily fabricated high density vias, demonstrated microfluidic capability, micro-lens or micro-lens array, high Young's modulus for stiffer packages, halogen free manufacturing, and economical manufacturing. Photoetchable glasses have several advantages for the fabrication of a wide variety of microsystems components. Microstructures have been produced relatively inexpensively with these glasses using conventional semiconductor processing equipment. In general, glasses have high temperature stability, good mechanical and electrically properties, and have better chemical resistance than plastics and many metals. One example of a glass ceramic for making the RF circulator/isolator of the present invention includes, for example, silicon oxide ($SiO_2$) of 75-85% by weight, lithium oxide ($Li_2O$) of 7-11% by weight, aluminum oxide ($Al_2O_3$) of 3-6% by weight, sodium oxide ($Na_2O$) of 1-2% by weight, 0.2-0.5% by weight antimonium trioxide ($Sb_2O_3$) or arsenic oxide ($As_2O_3$), silver oxide ($Ag_2O$) of 0.05-0.15% by weight, and cerium oxide ($CeO_2$) of 0.01-0.04% by weight. As used herein the terms "APEX® Glass ceramic", "APEX® glass" or simply "APEX®" are used to denote one embodiment of the glass ceramic composition for making the RF circulator/isolator of the present invention.

The APEX®™ glass can be filled with metal, alloys, composites, glass or other magnetic media, by a number of methods including plating or vapor phase deposition. The magnetic permittivity of the media combined with the dimensions and number of structures (loops, turns or other inductive element) in the device provide the inductance of devices. Depending on the frequency of operation the RF circulator/isolator device design will require different magnetic permittivity materials. At low frequencies, less than 100 MHz devices can use ferrites or other high different magnetic permittivity materials. At higher frequencies >100 MHz high different magnetic permittivity materials can generate eddy currents creating large electrical losses. So at higher frequency operations material such as copper or other similar material is the media of choice for RF circulator/isolator devices. Once the RF circulator/isolator device has been generated the supporting APEX®™ glass can be left in place or removed to create a free-standing structure such as the RF circulator/isolator of the present invention.

To avoid the problems with making devices in glass ceramics, the present invention uses glass ceramics with an average etch aspect ratio greater than 50:1. This allows users to create smaller and deeper features. Additionally, the manufacturing process taught herein enables product yields of greater than 90% (legacy glass yields are closer to 50%). Lastly, in legacy glass ceramics, approximately only 30% of the glass is converted into the ceramic state, whereas with APEX™ Glass ceramic this conversion is closer to 70%.

The present invention includes a method for fabricating a RF circulator/isolator in a glass ceramic structure for use in forming RF circulator/isolator structures used in electromagnetic transmission, transformers, filtering and other applications. The present invention includes an RF circulator/isolator structure created in the multiple planes of a glass-ceramic substrate, such process employing the (a) exposure to excitation energy such that the exposure occurs at various angles by either altering the orientation of the substrate or of the energy source, (b) a bake step and (c) an etch step. Angle sizes can be either acute or obtuse. The curved and digital structures are difficult, if not infeasible to create in most glass, ceramic or silicon substrates. The present invention has created the capability to create such RF circulator/isolator structures in both the vertical as well as horizontal plane for glass-ceramic substrates. The present invention includes a method for fabricating of a RF circulator/isolator structure on or in a glass ceramic.

Ceramicization of the glass is accomplished by exposing the entire glass substrate to approximately 20 J/cm2 of 310 nm light. When trying to create glass spaces within the ceramic, users expose all of the material, except where the glass is to remain glass. In one embodiment, the present invention can use, e.g., a quartz/chrome mask containing the various components of the RF circulator/isolator, e.g., the coil(s), connectors or electrical conductor(s), capacitor(s), resistor(s), ferrous and/or ferromagnetic component(s), etc.

The present invention includes a method for fabricating a RF circulator/isolator device in or on glass ceramic structure electrical microwave and radio frequency applications. The glass ceramic substrate may be a photosensitive glass substrate having a wide number of compositional variations including but not limited to: 60-76 weight % silica; at least 3 weight % $K_2O$ with 6 weight %-16 weight % of a combination of $K_2O$ and Na2O; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. This and other varied compositions are generally referred to as the APEX®™ glass.

Any exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that have an aspect ratio of at least 30:1, and to create an inductive structure. The mask for the exposure can be of a halftone mask that provides a continuous grey scale to the exposure to form a curved structure for the creation of an inductive structure/device. A digital mask can also be used with the flood exposure and can be used to produce for the creation an inductive structure/device. The exposed glass is then baked typically in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, wherein the etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch ratio of at least 30:1. In certain cases, the material surrounding the RF circulator/isolator device is converted to ceramic before metal filling to make the RF circulator/isolator of the present invention.

Some of the optimization parameters include, but are not limited to: (1) independent variables to be manipulated will be: a) iron content b) epoxy content c) bake time d) bake temp e) type of iron f) cavity height g) vacuum pulling to degas iron core; (2) optimization of the iron core material will be achieved when an iron ratio is determined that maintains structural integrity and original electrical parameters through reliability testing; and/or (3) identification of an ideal material that can be used consistently from one part to the next and follows or uses a standardized set of parameters that can be used by the customer for specific customer part optimization.

Next, one or more validation Steps can be followed, including, but not limited to: (1) Visual inspection will include a measurement of cavity depth before filling with iron and a recess measurement performed after iron fill. Quality of iron dispersion throughout hybrid material will be inspected; (2) Conductance will be measured prior to iron fill, after iron fill and again after reliability testing; (3) Reliability will be primarily measured with a set number of thermocycler rotations. Visual inspection and conductance will be performed an additional time after thermocyling. If necessary, parts will be pulled from the thermocycler, tested, and then placed back into the thermocycler for a greater number of cycles to create a time study for the amount of temperature cycling a part can withstand while maintaining consistent parameters; and/or (4) Inductance measurements will be performed before iron fill and then will also be taken before and after reliability to determine the overall improvement of adding the iron core and then the consistency of the iron core over time and with temperature cycling.

Moreover, the Iron Hybrid Material can also be optimized or identified. To do so, one or more core measurements are obtained or determined. Non-limiting examples of core measurements can include: (1) a quantifiable value or range of values for magnetic and electrical character of the iron hybrid material. (2) temperature ranges and a timeframe that the material can be expected to withstand for the selected ratio of iron present in the final hybrid material. (3) The material can be evaluated using thermocycler testing at given number of cycle and repeating. (4) In addition, the zeta, stereoscope and other microscopes will be used to analyze surface grain, recess and qualitative assessment for iron hybrid dispersion and packing. (5) Permittivity values will be theoretically achieved using conductance (representing imaginary values) and capacitative vs. inductive effect (representing real values). The ratio of real and imaginary (if determined to be a finite value) will then be used to provide a value for the phase lag between electrical and magnetic properties in the material.

As regards the Permittivity values, these can include using: (1) a cavity resonator (aka RF resonator) can be used to calculate the permittivity in an experimental setting. Define: Cavity resonator=a sealed container that can run electromagnetic waves back and forth across the cavity. It will be interrupted by the iron hybrid substrate which can be compared to a calibrated standard for the empty container. (2) The development and use of a separate toroidal inductor (manually wound wire) could also yield potential for measurement of inductance for permittivity calculations. (3) Drafting of a code to assess further parameters of relative permittivity (dielectric constant) as well as complex permittivity (interaction of electric and magnetic waves).

As regards permeability of the iron hybrid, this can be determined by implementing the particle size of the iron and an evaluation of grain structure and this will lead to more information on the magnetization of the iron as well as the magnetic field itself. The measurements can also include scanning electron microscopy (SEM)/Energy Dispersive X-Ray (EDX) to determine the arrangement and spacing between iron aggregated particles. Zeta images can be used to evaluate grain structure patterns present on the surface of the material. This can also be used to assess differences between different iron materials because grain structure will vary. Further, resistance measurements can be measured on Rohde & Schwarz as well as existing using existing toolsets and can be translated into the current present in the inductor. The absolute permeability can be determined with the inductor resistance, frequency, and/or input voltage. Additionally, absolute can be compared to theoretical using the number of turns on the given inductor.

As regards Frequency values, these can also be measured along with permeability to determine how the permeability will affect the frequency at which the customer component should be evaluated. This will help to further define the appropriate ratio in the iron hybrid material. Furthermore, this will define ranges that are real or complex and will aid in the determination of loss tangent. For example, a Rohde & Schwarz toolset as well as other available tools can be used to measure frequency values for individual parts. This falls in line with the existing techniques used to evaluate for frequency. Thus, overall knowledge of iron hybrid material will lead into next steps to determine how to apply power to circulator and result in correct direction of flow and the correct cancellation of signals to avoid part damage or malfunction. Also, Permittivity is a very important value in this determination because it must be correctly polarized to run in the correct direction.

The RF circulator/isolator can also be evaluated using a model Circulator in Software. Software sourcing can include: (1) NI AWR+Analyst (National Instruments, USA), which has a custom material section which includes areas to input permeability and complex permittivity, and also includes the opportunity to define permanent magnetics. First order software can be used for EM simulation. (2) COMSOL software (or similar physics-based simulation software such as EMPro). COMSOL, with the AC/DC module, is capable of adding in permanent magnets into the simulation environment. Additionally, the software is flexible to include custom equations for the definition that would be derived to define the magnetic core material. Several device architectures and product splits can also be modeled and transferred into 2D flat models with defined layer definitions for production. Finally, product build specifications (e.g. substrate thickness, metal line widths, etc.) and tolerances are determined.

Production of devices. Upon the completion of EM modeling, the design is transferred from the 2D flat models into production lithography masks, which are then used to make wafers with the RF circulator/isolator in glass or ceramic.

Test and validation of the RF circulator/isolator. The product design will incorporate both SMT and probe-launched circulator structures. The RF circulator/isolator can be made with surface mount technologies (SMT) devices that can be soldered directly onto a printed circuit board (PCB), or something similar, test board that will be capable of 3-port testing of the RF performance of the circulator and de-embedding the connectors and test boards to validate the de-embedded performance of the circulator. The present inventors have developed a set of low-loss SMT launches and board-level calibration standards which will be leveraged for this portion of the work. A probe-launch circulator device with probe launch design and on-wafer calibration structures can be validated as low-loss test and calibration structures from 0.5-40 GHz. For example, a 250 um pitch ground-signal-ground (GSG) probes enable on wafer 3-port measurement of the circulator as an integrated passive device, which is designed and laid out as described herein.

Product wafers can also include a variety of statistical process control (SPC) monitors die (5 locations per wafer) for on-wafer production control. This includes the following: (1) Standard SPC monitoring, e.g., via resistance, surface metal line resistance monitoring, layer-to-layer alignment validation, and/or feature size validation. Also, standard RF SPC monitoring can include, inductor validation, capacitor validation, microstrip transmission line performance validation. Finally, advanced RF SPC monitoring for this product definition can include: magnetic core validation structure to ensure consistent magnetic core performance and/or permanent magnet validation structure to validate performance and alignment.

One non-limiting example of a substrate for use with the circulator/isolator device present invention includes, e.g., a glass micromachined with etch ratios of 30:1 or more using a mid-ultraviolet flood exposure system and potentially 40:1 or more (preferably 50:1 or more) using a laser-based exposure system, to produce high-precision structures. Thus, for example, with nearly vertical wall slopes on both the inside and outside diameters of hollow photostructured microneedles only minor wall-thickness variation from tip to base would occur. In addition, microposts, which are non-hollow microneedles, may be micromachined to possess a low wall slope, enabling a decrease in the overall micropost diameter. Likewise, micro-lenses can be shaped with precisely controlled horizontal variations and have only minor vertical variation.

Furthermore, the precision shape of a glass structure with an anisotropic-etch ratio of 40:1 or more can be used to determine the shape of a non-glass material in the negative mold. A mold material can be: (1) deposited onto a shaped glass structure with a high-anisotropic-etch ratio to provide a negative mold; (2) the negative mold removed from the glass device; (3) a non-glass material cast into the negative mold; (4) the material in the negative mold is solidified; (5) the solidified non-glass material removed from the negative mold to provide a precision (e.g. anisotropic-etch ratio of 40:1 to 50:1) casting of a non-glass material. Furthermore, unlike expensive dry-etching processes used in silicon-semiconductor-type processes, this process can produce very high anisotropic-etch ratios with relatively inexpensive wet etching.

The circulator/isolator device of the present invention can be fabricated in a shaped glass structure with a high-anisotropic-etch ratio, using a photosensitive glass substrate having a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. This varied composition is generally referred to as the APEX. At least one portion of the photosensitive glass substrate is exposed to ultraviolet light, while leaving at least a second portion of said glass substrate unexposed; the glass substrate is heated to a temperature near the glass transformation temperature to transform at least part of the exposed glass to a crystalline material; and the glass substrate is etched in an etchant, wherein the etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch ratio of at least 30:1. Percentages herein are in weight percent of the constituents.

The circulator/isolator device of the present invention can be fabricated in a photosensitive, shaped glass structure with a high-anisotropic-etch ratio, can be composed of: 35-76 weight % silica, 3-16 weight % $K_2O$, 0.003-1 weight % $Ag_2O$, 0.75-13 weight % $B_2O_3$, 8-15 weight % $Li_2O$, and 0.001-0.1 weight % $CeO_2$. This photosensitive glass is processed using at least on of the following steps: At least one portion of the photosensitive glass substrate is exposed to ultraviolet light, while leaving at least a second portion of said glass substrate unexposed; the glass substrate is heated to a temperature near the glass transformation temperature to transform at least part of the exposed glass to a crystalline material; and the glass substrate is etched in an etchant, wherein the etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch ratio of at least 30:1.

The circulator/isolator device of the present invention can be fabricated using a method to fabricate a shaped glass structure with a high-anisotropic-etch ratio, using a photosensitive glass substrate having a composition of: 46-76 weight % silica, 3-16 weight % $K_2O$, 0.003-1 weight % $Ag_2O$, 0.75-13 weight % $B_2O_3$, 6-7 weight % $Al_2O_3$, 11-15 weight % $Li_2O$, and 0.001-0.1 weight % $CeO_2$. The photosensitive glass is processed using at least one of the following steps: At least one portion of the photosensitive glass substrate is exposed to ultraviolet light, while leaving at least a second portion of said glass substrate unexposed; the glass substrate is heated to a temperature near the glass transformation temperature to transform at least part of the exposed glass to a crystalline material; and the glass substrate is etched in an etchant, wherein the etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch ratio of at least 30:1. Our analysis indicates that the formation of smaller crystalline $LiAlSi_2O_6$ during the processing may be an important factor in the observed sensitivity to ultraviolet light exposure and etch rate.

In one embodiment, the circulator/isolator device of the present invention is essentially germanium-free. In some embodiments, $Sb_2O_3$ or $As_2O_3$ is added (e.g. at least 0.3 weight % $Sb_2O_3$ or $As_2O_3$) to help control the oxidation state of the composition. In some preferred embodiments, at least 0.75 weight % $B_2O_3$ is included, and in others at least 1.25 weight % $B_2O_3$ is included. In some preferred embodiments, at least 0.003% $Au_2O$ is included in addition to at least 0.003 weight % $Ag_2O$. In some embodiments, a combination of CaO and/or ZnO is added up to 18 weight %. In some embodiments, up to 10 weight % MgO is added. In some embodiments, up to 18 weight % lead oxide is added. Up to 5 weight %, $Fe_2O_3$, may be added to make the material paramagnetic and iron (II) and iron (III) may be added as a quenching agent to reduce autofluorescence of the glass.

Preferably, the glass substrate is heated to a temperature of 420-520° C. for between 10 minutes and 2 hours and then heated to a temperature range heated to 520-620° C. for between 10 minutes and 2 hours.

In some embodiments, the etchant is HF, in some embodiments the etchant is a combination of HF and additional ingredients, such as hydrochloric acid or nitric acid. The preferred wavelength of the ultraviolet light used for exposure is approximately 308-312 nm.

In one embodiment, the circulator/isolator device of the present invention is present invention is in a shaped glass structure with a high anisotropic-etch ratio having a photosensitive glass substrate with a glass transformation temperature. The photosensitive glass substrate may have one or more patterned structure and a glass composition of about 60-76 weight % silica, 6 weight %-16 weight % of a combination of $K_2O$ and $Na_2O$ with at least 3 weight % $K_2O$, 0.001-1 weight % $Ag_2O$, 0.75 weight %-7 weight % $B_2O_3$, and 5-8 weight % $Al_2O_3$, with the combination of $B_2O_3$, and $Al_2O_3$ not exceeding 13 weight %, 8-15 weight % $Li_2O$, and 0.04-0.1 weight % $CeO_2$.

The patterned structure may have at least one portion exposed to an activating energy source such as ultraviolet light and at least a second portion of the glass substrate not exposed to the ultraviolet light. Part of this exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure with an aspect ratio of at least 30:1, and to provide shaped glass structures with an aspect ratio much greater than 30:1 when the glass is exposed using a high powered energy source, such as a laser.

Preferably, the shaped glass structure contains at least one of; a micro-optic lens, a micro-optic micro-post, a micro-channel, or micro-ridge micro-optic waveguide. The micro-ridge, optical waveguide may be formed by etching away exposed glass to leave a glass micro-ridge such that light is guided by the micro-ridge. The micro-ridge may be formed using a layer of photosensitive glass overlying a layer of non-photosensitive glass of lower index of refraction than the photosensitive glass, to substantially prevent micro-ridge-guided light from leaving the bottom of the micro-ridge in at least one portion of the micro-ridge (e.g. bottom vias may be etched in the non-photosensitive glass to allow light coupling to a light guide on a lower level).

In this embodiment, the circulator/isolator device of the present invention is formed in a composition of shaped glass structure that is essentially be germanium-free, contain at least 0.5 weight % $B_2O_3$ or contain at least 1.25 weight % $B_2O_3$, contain at least 0.3 weight % $Sb_2O_3$ or $As_2O_3$, contain 0.003-1 weight % of at least one of $Au_2O$ and $Ag_2O$, contains 1-18 weight % of an oxide such as of CaO, ZnO, PbO, MgO and BaO, contain 0-5 weight %, iron ($Fe_2O_3$) to make the composition paramagnetic and/or to use iron (II) and iron (III) to quench intrinsic autofluorescence, and contain up to 2 weight % Copper Oxide. The shaped glass structure may also have an anisotropic-etch ratio of about 30-45:1.

In another embodiment, the circulator/isolator device of the present invention is a shaped glass structure with a high anisotropic-etch ratio having a photosensitive glass substrate with a glass transformation temperature. The photosensitive glass substrate may have one or more patterned structure, and a glass composition of about 35-76 weight % silica, 3-16 weight % $H_2O$, 0.001-1 weight % of at least one oxide such as $Ag_2O$ and $Au_2O$, 0.75-13 weight % $B_2O_3$, 8-15 weight % $Li_2O$, and 0.0014-0.1 weight % $CeO_2$.

In this embodiment, the patterned structure may have at least one portion exposed to an activating energy source such as ultraviolet light and at least a second portion of the glass substrate not exposed to the ultraviolet light. Part of this exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure with an aspect ratio of at least 30:1, and to provide shaped glass structures with an aspect ratio much greater than 30:1 when the glass is exposed using a high powered energy source, such as a laser.

In addition, the composition of the shaped glass structure may essentially be germanium-free, contain at least 0.5 weight % $B_2O_3$ or at least 1.25 weight % $B_2O_3$.

In another embodiment, the present invention is a shaped glass structure with a high anisotropic-etch ratio having a photosensitive glass substrate with a glass transformation temperature. The photosensitive glass substrate may have one or more patterned structure, and a glass composition of about 46-76 weight % silica, 3-16 weight % $H_2O$, 0.001-1 weight % $Ag_2O$, 0.5-13 weight % $B_2O_3$, 8-15 weight % $Li_2O$, and 0.001-0.1% $CeO_2$. For example, the photosensitive glass substrate may have one or more patterned structure, and a glass composition of about 45, 50, 55, 60, 70, 75 or 76 weight % silica; 3, 5, 7, 8, 10, 12 or 16 weight % $K_2O$; 0.001, 0.01, 0.1, 0.25, 0.5, 0.75 or 1 weight % $Ag_2O$; 0.5, 1, 2.5, 5, 7.5, 10, 12.5 or 13 weight % $B_2O_3$; 8, 7, 9, 10, 12.5 or 15 weight % $Li_2O$; and 0.001, 0.01, 0.05 or 0.1% $CeO_2$.

In this embodiment, the patterned structure may have at least one portion exposed to an activating energy source such as ultraviolet light and at least a second portion of the glass substrate not exposed to the ultraviolet light. Part of this exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure with an aspect ratio of at least 30:1, and to provide shaped glass structures with an aspect ratio much greater than 30:1 when the glass is exposed using a high powered energy source, such as a laser.

The glass structure for the circulator/isolator device of the present invention is may be patterned to create exposed regions of higher index of refraction surrounded by areas of lower index of refraction, such that light is substantially contained within the higher index of refraction material. Conversely, the patterned glass structure may be patterned to create exposed regions of higher index of refraction surrounding areas of lower index of refraction, such that light is substantially contained within the lower index of refraction material. Either way, exposing our glass with such ultraviolet light can raise index of refraction of the glass and the changed index of refraction may used to direct, manipulate, or process photons. Thus in some cases, etching of the glass is not necessary to direct light within such a patterned glass structure.

In some embodiments, the patterned glass structure is heated to above its glass transition temperature for between 10 minutes and 2 hours to allow the noble metal to coalesce and act as nuclei for devitrification in the exposed portion of the photosensitive glass substrate, and then the glass substrate is heated above its glass-ceramic transition temperature (at least 25 C above its glass transition temperature) for between 10 minutes and 2 hours. This provides for transformation of the exposed portion of the photosensitive glass substrate into a glass-ceramic during a subsequent cooling of the glass substrate. The glass substrate can then be etched in an HF-containing etchant solution, to give an etch ratio of exposed-portion to unexposed-portion of at least 30:1 in a shaped glass structure.

In some embodiments, a surface-smoothing acid containing at least one of nitric acid is used to dissolve surface metallic silver and/or hydrochloric acid is used to dissolve surface cerium metal is used during or after the HF etch, to reduce surface roughness of at least one micro-optic device in the shaped glass structure, such that light transmission through surfaces of a micro-optic device is increased. The final patterned glass structure may also be annealed near its glass transition temperature to smooth out etched side walls.

Patterned glass structures that may be formed include micro-optic lenses, micro-optic micro-posts, and micro-optic waveguides such as micro-channels, micro-ridges (exposed glass is etched away to leave a glass micro-ridge), and index of refraction guides formed by patterned exposure of the glass.

In some embodiments, the patterned glass structure is processed by flood exposing to 300-320 nm light and heated to a temperature near its glass transformation temperature to allow at least part of the reduced noble metal to coalesce to provide a patterned glass structure is used to form larger clusters for at least one plasmon analytical technique, e.g. surface enhanced fluorescence, surface enhanced Raman spectroscopy, and surface plasmon resonance.

In some embodiments, the circulator/isolator device of the present invention is patterned in a glass structure forms at least part of a multilayer optical printed circuit board. This may also be a method to make a micro-optical interconnection apparatus, comprising: preparing a first photosensitive glass layer having a first glass transformation temperature and having a composition comprising: less than 76% silica, at least 0.0008% of at least one of a noble metal oxide and/or a copper oxide, at least 11% $Li_2O$, and at least 0.0014% $CeO_2$; exposing a first set of paths in the first photosensitive glass layer with ultraviolet light 240 to 360 nm light or a directed source of protons, while leaving at least a second portion of the first glass layer unexposed; depositing an ultraviolet-light reflecting-or-absorbing layer on the first layer; depositing a layer of non-photosensitive glass on the ultraviolet-light reflecting-or-absorbing layer; patterning and etching vias in the ultraviolet-light reflecting-or-absorbing layer and the non-photosensitive glass layer to provide light-coupling vias; depositing a second photosensitive glass layer on the patterned and etched non-photosensitive glass, the second photosensitive glass layer having a second glass transformation temperature and having a composition comprising, less than 72% silica, at least 0.008% of at least one of a noble metal oxide and a copper oxide, at least 11% $Li_2O$, at least 0.75% $B_2O_3$, and at least 0.0014% $CeO_2$, wherein the second photosensitive glass layer has a higher index of refraction than the non-photosensitive glass; exposing a second set of paths in the second photosensitive glass layer with ultraviolet light 300 to 320 nm light or a directed source of protons, while leaving at least a second portion of the second photosensitive glass layer unexposed; and heating the photosensitive glass layers to above their glass transformation temperatures to raise the index of refraction of the first and second sets of paths to render the sets of paths light-guiding.

This may also be a method to make a micro-optical interconnection apparatus, comprising: preparing a first photosensitive glass layer having a first glass transformation temperature; exposing a first set of paths in the first photosensitive glass layer with ultraviolet light 240 to 360 nm light or a directed source of protons, while leaving at least a second portion of the first glass layer unexposed; depositing an ultraviolet-light reflecting-or-absorbing layer on the first layer; depositing a layer of non-photosensitive glass on the ultraviolet-light reflecting-or-absorbing layer; patterning and etching vias in the ultraviolet-light reflecting-or-absorbing layer and the non-photosensitive glass layer to provide light-coupling vias; depositing a second photosensitive glass layer on the patterned and etched non-photosensitive glass, the second photosensitive glass layer having a second glass transformation temperature and having a composition comprising, less than 72% silica, at least 0.008% of at least one of a noble metal oxide and a copper oxide, at least 11% $Li_2O$, at least 0.75% $B_2O_3$, and at least 0.0014% $CeO_2$, wherein the second photosensitive glass layer has a higher index of refraction than the non-photosensitive glass; exposing a second set of paths in the second photosensitive glass layer with ultraviolet light 300 to 320 nm light or a directed source of protons, while leaving at least a second portion of the second photosensitive glass layer unexposed; and heating the photosensitive glass layers to above their glass transformation temperatures to raise the index of refraction of the first and second sets of paths to render the sets of paths light-guiding.

In some embodiments, the circulator/isolator device of the present invention is formed in a photosensitive glass substrate comprising at least silica, lithium oxide, aluminum oxide, and cerium oxide; forming one or more metal vias in the photosensitive glass substrate; masking a design layout comprising an inlet and an outlet connected by one or more paths oriented within the photosensitive glass substrate; exposing at least one portion of the photosensitive glass substrate to an activating energy source; exposing the photosensitive glass substrate to a heating phase of at least ten minutes above its glass transition temperature; cooling the photosensitive glass substrate to transform at least part of the exposed glass to a crystalline material to form a glass-crystalline substrate; and etching the glass-crystalline substrate with an etchant solution to form an etched design layout comprising the one or more paths in optical communication with the one or more metal vias to transport and reflect the light in the substrate.

A photo-definable glass substrate for the circulator/isolator device of the present invention comprises at least 0.3 weight % $Sb_2O_3$ or $As_2O_3$. The photo-definable glass substrate comprises 0.003-1 weight % $Au_2O$. The photo-definable glass substrate comprises 1-18 weight % of an oxide selected from the group consisting of CaO, ZnO, PbO, MgO and BaO. The anisotropic-etch ratio of exposed portion to said unexposed portion is at least one of 10-20:1; 21-29:1; 30-45:1; 20-40:1; 41-45:1; and 30-50:1. The etchant may be hydrofluoric acid. The activating energy source may be an ultraviolet light having a wavelength of about 308-312 nm.

Another photo-definable glass ceramic substrate for the circulator/isolator device of the present invention is a photosensitive glass substrate having a wide number of compositional variations including but not limited to: $SiO_2$; $K_2O$; $Na_2O$; $Ag_2O$; $Au_2O$; $Cu_2O$; $B_2O_3$; $Al_2O_3$ $Li_2O$; and/or $CeO_2$. Different commercially available forms of photo-definable glass include APEX® Glass and FOTURAN™. APEX® Glass is a registered trademark to 3D Glass Solutions, Inc. and FOTURAN™ is a trademark to Schott, Inc.

Figure 2:
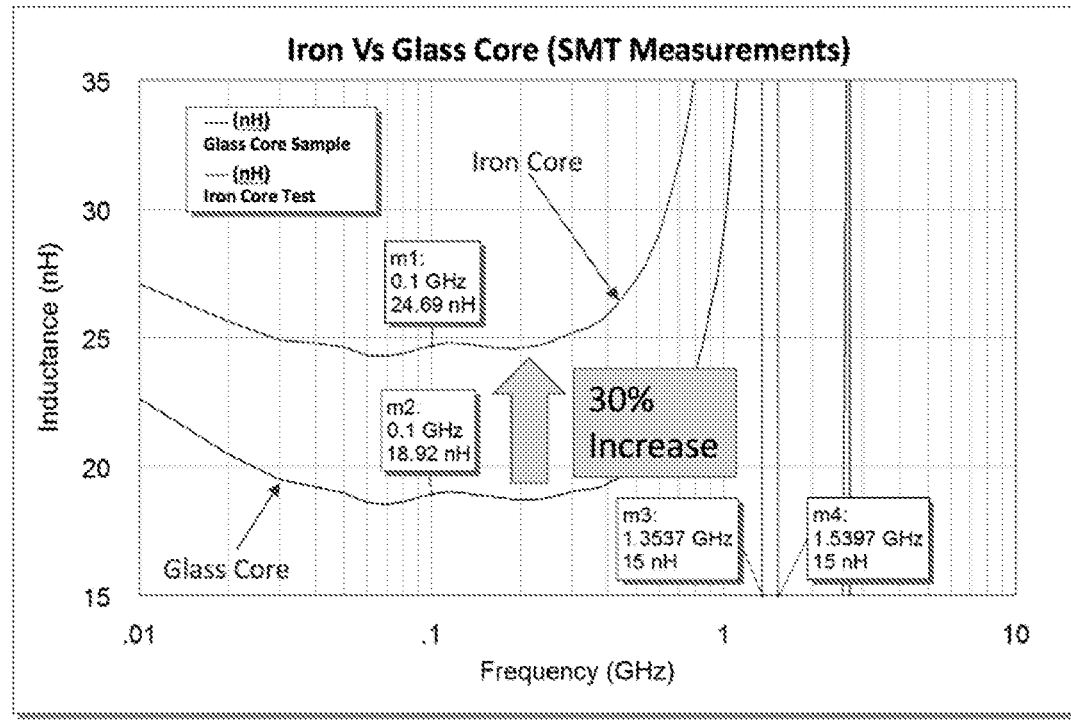
FIG. 2 shows the results from the RF circulator/isolator device of the present invention

FIG. 2 is a graph that shows the results from using an RF circulator/isolator device of the present invention. Briefly, The inductor is a critical element in an RF circulator. The inductance determines the efficiency and size of the RF circulator. The iron core inductor has enhanced performance relative a glass or hollow core inductor reducing the size and losses of an RF Circulator or other RF devices including filters and isolators.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

To aid the Patent Office, and any readers of any patent issued on this application in interpreting the claims appended hereto, applicants wish to note that they do not intend any of the appended claims to invoke paragraph 6 of 35 U.S.C. § 112, U.S.C. § 112 paragraph (f), or equivalent, as it exists on the date of filing hereof unless the words "means for" or "step for" are explicitly used in the particular claim.

For each of the claims, each dependent claim can depend both from the independent claim and from each of the prior dependent claims for each and every claim so long as the prior claim provides a proper antecedent basis for a claim term or element.

What is claimed is:

1. A circulator/isolator device comprising:
   a substrate comprising one or more conductive coils, wherein the substrate is a photosensitive glass ceramic composite substrate comprising at least silica, lithium oxide, aluminum oxide, and cerium oxide, and wherein the one or more conductive coils are formed in, on, or about the substrate;
   an opening in the substrate comprising an iron core, wherein the iron core is formed in the substrate after the formation of the one or more conductive coils, wherein the iron core is positioned and shaped to create a circulator/isolator in the substrate; and
   one or more connectors, vias, resistors, capacitors, or other integrated circuits of devices connected to the conductive coils of the circulator/isolator.

2. The device of claim 1, wherein the device further comprises a passivation or coating on the device to protect the device from the environment.

3. The device of claim 1, wherein the iron core is formed in situ after formation of the one or more conductive coils.

4. The device of claim 1, wherein the conductive coils comprise copper.

5. The device of claim 1, wherein the circulator/isolator device has a reduced signal loss when compared to existing circulator/isolator devices.

6. The device of claim 1, wherein the circulator/isolator device has a loss of less than 50, 40, 30, 25, 20, 15, or 10% of the signal input versus an signal output.

7. The device of claim 1, wherein the iron core comprises melted or sintered iron particles, microparticles, or nanoparticles.

8. The device of claim 1, wherein a geometry of the circulator/isolator device is substantially circular.

9. The device of claim 1, wherein the substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$.

10. The device of claim 1, wherein the substrate is a glass substrate comprising a composition of: 35-76 weight % silica, 3-16 weight % $K_2O$, 0.003-1 weight % $Ag_2O$, 0.75-13 weight % $B_2O_3$, 8-15 weight % $Li_2O$, and 0.001-0.1 weight % $CeO_2$.

11. The device of claim 1, wherein the substrate is at least one of: a photo-definable glass substrate comprising at least 0.3 weight % $Sb_2O_3$ or $As_2O_3$; a photo-definable glass substrate comprising 0.003-1 weight % $Au_2O$; a photo-definable glass substrate comprising 1-18 weight % of an oxide selected from the group consisting of CaO, ZnO, PbO, MgO and BaO; and optionally has an anisotropic-etch ratio of an exposed portion to an unexposed portion is at least one of 10-20:1; 21-29:1; 30-45:1; 20-40:1; 41-45:1; and 30-50:1.

12. An RF circulator/isolator device made by a method comprising:
forming on a substrate one or more conductive coils, wherein the substrate is a photosensitive glass ceramic composite substrate comprising at least silica, lithium oxide, aluminum oxide, and cerium oxide, and wherein the one or more conductive coils are formed in, on, or about the substrate;
etching an opening in the substrate;
depositing iron particles in the opening;
melting or sintering the iron particles into an iron core, wherein the iron core is formed in the substrate after the formation of the one or more conductive coils, wherein the iron core is positioned and shaped to create a circulator/isolator in the substrate; and
connecting the conductive coils of the circulator/isolator to an amplifier and an antenna.

13. A method for making a circulator/isolator device, the method comprising:
forming on a substrate one or more conductive coils, wherein the substrate is a photosensitive glass ceramic composite substrate comprising at least silica, lithium oxide, aluminum oxide, and cerium oxide, and wherein the one or more conductive coils are formed in, on, or about the substrate;
etching an opening in the substrate;
depositing iron particles in the opening;
melting or sintering the iron particles into an iron core, wherein the iron core is formed in the substrate after the formation of the one or more conductive coils, wherein the iron core is positioned and shaped to create a circulator/isolator in the substrate; and
connecting the conductive coils of the circulator/isolator to one or more connectors, vias, resistors, capacitors, or other integrated circuits of devices connected to.

14. The method of claim 13, further comprising coating or depositing a passivation or coating on the circulator/isolator device to protect the circulator/isolator device from the environment.

15. The method of claim 13, further comprising forming iron core in situ after the step of forming the one or more conductive coils.

16. The method of claim 13, further comprising forming iron core in situ after the step of forming the one or more conductive coils in the presence of a noble gas.

17. The method of claim 13, wherein the conductive coils comprise copper.

18. The method of claim 13, wherein the circulator/isolator device has a reduced signal loss when compared to existing circulator/isolator devices.

19. The method of claim 13, wherein the circulator/isolator device has a loss of less than 50, 40, 30, 25, 20, 15, or 10% of the signal input versus an signal output.

20. The method of claim 13, wherein the iron core comprises melted or sintered iron particles, microparticles, or nanoparticles.

21. The method of claim 13, wherein a geometry of the circulator/isolator device is substantially circular.

22. The method of claim 13, wherein the substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$.

23. The method of claim 13, wherein the substrate is a glass substrate comprising a composition of: 35-76 weight % silica, 3-16 weight % $K_2O$, 0.003-1 weight % $Ag_2O$, 0.75-13 weight % $B_2O_3$, 8-15 weight % $Li_2O$, and 0.001-0.1 weight % $CeO_2$.

24. The method of claim 13, wherein the substrate is at least one of: a photo-definable glass substrate comprising at least 0.3 weight % $Sb_2O_3$ or $As_2O_3$; a photo-definable glass substrate comprising 0.003-1 weight % $Au_2O$; a photo-definable glass substrate comprising 1-18 weight % of an oxide selected from the group consisting of CaO, ZnO, PbO, MgO and BaO; and optionally has an anisotropic-etch ratio of an exposed portion to an unexposed portion is at least one of 10-20:1; 21-29:1; 30-45:1; 20-40:1; 41-45:1; and 30-50:1.

* * * * *